(12) United States Patent
Rakib et al.

(10) Patent No.: US 7,206,357 B2
(45) Date of Patent: Apr. 17, 2007

(54) SYSTEM AND METHOD FOR AN IMPROVED QUADRATURE UPCONVERTER FOR I/Q MODULATION USING INTERMEDIATE FREQUENCY CARRIERS

(75) Inventors: Shlomo Rakib, Cupertino, CA (US); Oren Arad, Palo Alto, CA (US); Robert Fanfelle, Redwood City, CA (US)

(73) Assignee: Terayon Communications Systems, Inc., Santa Clara, CA (US)

( * ) Notice: Subject to any disclaimer, the term of this patent is extended or adjusted under 35 U.S.C. 154(b) by 724 days.

(21) Appl. No.: 10/701,978

(22) Filed: Nov. 4, 2003

(65) Prior Publication Data
US 2005/0094743 A1 May 5, 2005

(51) Int. Cl.
*H03K 7/06* (2006.01)
*H04L 27/12* (2006.01)

(52) U.S. Cl. .................................. 375/302
(58) Field of Classification Search ............ 375/298, 375/302–308; 332/100–105; 455/102, 103, 455/118
See application file for complete search history.

(56) References Cited
U.S. PATENT DOCUMENTS

| | | | |
|---|---|---|---|
| 4,816,783 A * | 3/1989 | Leitch | 332/103 |
| 5,412,351 A * | 5/1995 | Nystrom et al. | 332/103 |
| 6,535,073 B1 * | 3/2003 | Garg et al. | 332/103 |
| 2003/0141938 A1 * | 7/2003 | Poklemba et al. | 332/103 |

* cited by examiner

Primary Examiner—Don N. Vo
(74) Attorney, Agent, or Firm—Thelen Reid Brown Raysman & Steiner LLP (57) ABSTRACT

A signal transmitter for sending a radio signal is made up of an input for receiving input data and a first circuit for generating an inphase signal and a quadrature signal from the input data. A second circuit produces a first signal associated with a cosine of a first frequency and a third circuit that produces a second signal associated with a sine of the first frequency. A first modulator, coupled to the first circuit and the second circuit, upconverts the inphase signal with the first signal and produces a first upconverted signal. A second modulator, coupled to the first circuit and the third circuit, upconverts the inphase signal with the second signal and produces a second upconverted signal. A third modulator, coupled to the first circuit and the second circuit, upconverts the quadrature signal with the first signal and produces a third upconverted signal. A fourth modulator, coupled to the first circuit and the third circuit, upconverts the quadrature signal with the second signal and produces a fourth upconverted signal. A fourth circuit, coupled to the first and fourth modulators, combines the first upconverted signal and the fourth upconverted signal into a first intermediate signal. A fifth circuit, coupled to the second and third modulators, combines an inverse of the second upconverted signal and the third upconverted signal into a second intermediate signal. A quadrature modulator, coupled to the fourth circuit and the fifth circuit, converts the first intermediate signal and the second intermediate signal to an output signal. The output signal has a component at a first sideband of a second frequency, the first sideband frequency offset from the second frequency by a first amount. A filter, coupled to the quadrature modulator, passes the first sideband, and filters the second frequency and a second sideband, the second sideband offset from the second frequency by the inverse of the first amount.

27 Claims, 3 Drawing Sheets

Figure 1
SYSTEM AND METHOD FOR AN IMPROVED
QUADRATURE UPCONVERTER

SYSTEM AND METHOD FOR AN IMPROVED
QUADRATURE UPCONVERTER

SYSTEM AND METHOD FOR AN IMPROVED
QUADRATURE UPCONVERTER

SYSTEM AND METHOD FOR AN IMPROVED QUADRATURE UPCONVERTER FOR I/Q MODULATION USING INTERMEDIATE FREQUENCY CARRIERS

FIELD OF THE INVENTION

The present invention relates to an improved modulated communication system. More particularly, the present invention is related to creating and sending a signal having decreased distortion effects resulting from amplitude and phase imbalances in inphase/quadrature (I/Q) modulated signals.

BACKGROUND

Typically, when sending data using I/Q modulation, the transmitting system contains a number of analog devices. In a typical system performing the I/Q modulated data transmission, such units typically use a first modulator to upconvert a digital stream to the I/Q components. The I and Q components are then typically converted to an analog signal and sent to a quadrature modulator. The quadrature modulator then upconverts the I and Q components into a signal that is to be transmitted. The signal is then typically sent to a filter prior to transmission.

In short, a typical radio frequency (RF) transmitter first directly converts a baseband signal, composed of I and Q components to a RF signal. However, imperfections in the analog components create imbalances in processing of the signal. Such problems include I/Q amplitude and phase imbalances, as well as possible inherent DC biases. These imbalances can create distortions in the resultant signal, which, in turn, typically lead to a lower signal to noise ratio at the receiver or decoder.

SUMMARY

A signal transmitter for sending a radio signal is made up of an input for receiving input data and a first circuit for generating an inphase signal and a quadrature signal from the input data. A second circuit produces a first signal associated with a cosine of a first frequency and a third circuit that produces a second signal associated with a sine of the first frequency. A first modulator, coupled to the first circuit and the second circuit, upconverts the inphase signal with the first signal and produces a first upconverted signal. A second modulator, coupled to the first circuit and the third circuit, upconverts the inphase signal with the second signal and produces a second upconverted signal. A third modulator, coupled to the first circuit and the second circuit, upconverts the quadrature signal with the first signal and produces a third upconverted signal. A fourth modulator, coupled to the first circuit and the third circuit, upconverts the quadrature signal with the second signal and produces a fourth upconverted signal. A fourth circuit, coupled to the first and fourth modulators, combines the first upconverted signal and the fourth upconverted signal into a first intermediate signal. A fifth circuit, coupled to the second and third modulators, combines an inverse of the second upconverted signal and the third upconverted signal into a second intermediate signal. A quadrature modulator, coupled to the fourth circuit and the fifth circuit, converts the first intermediate signal and the second intermediate signal to an output signal. The output signal has a component at a first sideband of a second frequency, the first sideband frequency offset from the second frequency by a first amount. A filter, coupled to the quadrature modulator, passes the first sideband, and filters the second frequency and a second sideband, the second sideband offset from the second frequency by the inverse of the first amount.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention. The Figures contained in this disclosure are as follows.

DETAILED DESCRIPTION

Embodiments of the present invention are described herein in the context of a system and method for system and method for an improved quadrature upconverter for I/Q modulation using intermediate frequency carriers. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of digital systems, including hardware, software, or any combination thereof. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1:
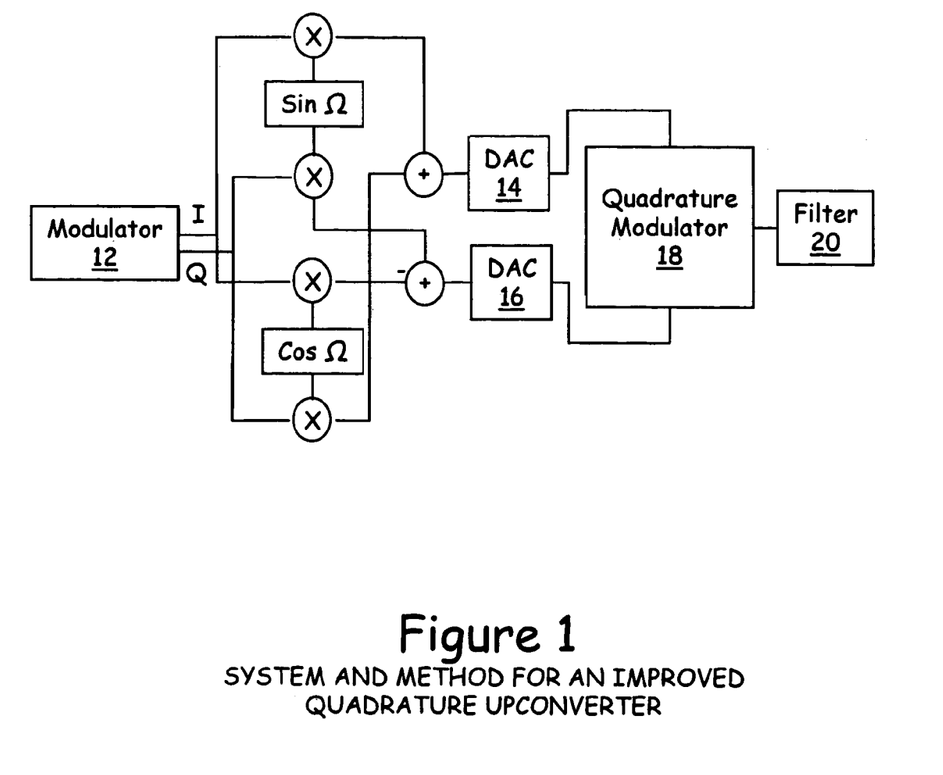
FIG. 1 is a schematic diagram of a system that provides an improved I/Q modulated signal according to the invention.

FIG. 1 is a schematic diagram of a system that provides an improved I/Q modulated signal according to the invention. A digital stream is input into a modulation system 10. The digital stream is input into a modulator 12. The modulator 12 produces an inphase (I) signal and a quadrature (Q) signal.

These I and Q signals are then modulated to an intermediate frequency (IF), that is $f_{IF}=\Omega_{IF}/2\pi$. The modulation is performed by generating signals associated with the intermediate frequency and applying the signals to the I and Q signals in a modulation circuitry. In this embodiment, two carrier phases (sin and cosine) of the intermediate frequency are generated, and are applied to the I and Q signals.

The modulated signals are then combined to form two IF signals. These combined signals are represented by Equations 1 and 2 as follows:

$$I_{IF}[n]=I[n]\cdot\cos(\Omega_{IF}n)-Q[n]\cdot\sin(\Omega_{IF}n);\qquad\text{(Eq. 1)}$$

$$Q_{IF}[n]=Q[n]\cdot\cos(\Omega_{IF}n)+I[n]\cdot\sin(\Omega_{IF}n).\qquad\text{(Eq. 2)}$$

The digital to analog converters (DACs) 14 and 16 convert the two modulated digital streams into two analog IF signals. The resulting signals $I_{IF}(t)$ and $Q_{IF}(t)$ are represented by Equations 3 and 4 as follows:

$$I_{IF}(t)=I(t)\cdot\cos(\omega_{IF}t)-Q(t)\cdot\sin(\omega_{IF}t);\qquad\text{(Eq. 3)}$$

$$Q_{IF}(t)=Q(t)\cdot\cos(\omega_{IF}t)+I(t)\cdot\sin(\omega_{IF}t).\qquad\text{(Eq. 4)}$$

The symbol $\omega_{IF}$ in Equations 3 and 4 refers to the quantity $\Omega_{IF}$ multiplied by fs, where fs is the sampling frequency of the DAC.

The resulting signals $Q_{IF}(t)$ and $I_{IF}(t)$ are sent to a quadrature modulator 18. The quadrature modulator 18 converts modified I and Q signals to a single radio frequency output. Under conditions in an embodiment of the invention, the quadrature modulator 18 operates on the signals $Q_{IF}(t)$ and $I_{IF}(t)$ to perform the operation as signified either in Equation 5a or 5b:

$$V_d(t)=A(I_{IF}(t)\cdot\cos(\omega_c t)-Q_{IF}(t)\cdot\sin(\omega_c t);\qquad\text{(Eq. 5a)}$$

$$V_d(t)=A(I_{IF}(t)\cdot\cos(\omega_c t)+Q_{IF}(t)\cdot\sin(\omega_c t);\qquad\text{(Eq. 5b)}$$

Where $V_d$ is the desired quadrature modulator output, A is the quadrature modulator gain, and $\omega_c$ is the carrier frequency. In this case, the quadrature modulator produces either an upper side band signal or a lower side band signal, as the individual circumstances merit.

Equation 5a is used to produce an upper side band (USB) signal centered at the frequency $\omega_c+\omega_{IF}$, or, as shown in Equation 6a:

$$V_d(t)=I(t)\cdot\cos((\omega_c+\omega_{IF})\cdot t)-Q(t)\cdot\sin((\omega_c+\omega_{IF})\cdot t).\qquad\text{(Eq. 6a)}$$

Equation 5b is used to produce a lower side band (LSB) signal centered at the frequency $\omega_c-\omega_{IF}$, or, as shown in Equation 6b:

$$V_d(t)=I(t)\cdot\cos((\omega_c-\omega_{IF})\cdot t)+Q(t)\cdot\sin((\omega_c-\omega_{IF})\cdot t).\qquad\text{(Eq. 6b)}$$

In many typical systems, the cosine and sin operations of the quadrature modulator 18 have inherent perturbations that affect the quality of the signal. These perturbations include gain differences, phase differences, and possible DC bias. In legacy systems, these perturbations affect the produced signal in a negative manner, leading to decreased reliability. In the current system, these imbalances are used to constructively enable increased as opposed to decreased reliability. In the current enablement, these perturbations are used to enable signal images occurring out of band. To compensate, an RF band pass filter 20 rejects these out of band images. This results in a more balanced signal.

In more detail, assume that the sin and cosine operations associated with the quadrature modulator 18 have a gain imbalance, a phase imbalance, and a DC bias. In this case Equation 5 can be restated as shown in Equation 7:

$$V(t)=G_I\cdot[(I_{IF}(t)+DC_I)\cdot\cos(\omega_c t+\phi_I)]\pm G_Q\cdot[(Q_{IF}(t)+DC_Q)\cdot\sin(\omega_c t+\phi_Q)];\qquad\text{(Eq. 7)}$$

where $G_I$ and $G_Q$ are the gain imbalances in the I and Q branches, $\phi_I$ and $\phi_Q$ are phase imbalances in the I and Q branches, and $DC_I$ and $DC_Q$ are the additive DC biases in the I and Q branches.

In Equation 8, the LSB portion of the signal from the quadrature modulator is selected for demonstrative purposes. In this case, the gain imbalances and the phase imbalances may be written as relative imbalances between the two branches. Accordingly, Equation 7 may be rewritten as:

$$V(t)=(A+\beta)\cdot[(I_{IF}(t)+DC_I)\cdot\cos(\omega_c t+\phi)]+(A-\beta)\cdot[(Q_{IF}(t)+DC_Q)\cdot\sin(\omega_c t-\phi)].\qquad\text{(Eq. 8)}$$

In this case, $\beta$ represents the relative gain imbalance between the inphase and quadrature components, and $\phi$ represents the relative phase imbalance between the inphase and quadrature components.

It should be noted that the representation indicates that the unbalanced signal now is phase shifted. That is the unbalanced signal is phase shifted in a manner relating to the frequency $\omega_c t-\phi$ and the frequency $\omega_c t+\phi$.

Taking the signal of Equation 8, this signal may be broken down into constituent parts. In particular, the signal of Equation 8 may be then considered in terms of DC components and IQ components, or:

$$V(t)=V_{DC}(t)+V_{IQ}(t).$$

Arbitrarily, let us assume that the quadrature modulator is designed to produce the LSB signal. In this case, the addition branch of Equation 8 is selected. In terms of Equation 8, after the selection of the lower side band, the DC component of Equation 8 may be written in Equation 9 as:

$$V_{DC}(t)=(A+\beta)\cdot(DC_I)\cdot\cos(\omega_c t+\phi)+(A-\beta)\cdot(DC_Q)\cdot\sin(\omega_c t-\phi).\qquad\text{(Eqn. 9)}$$

It should be noted that $\phi$ is constant, and the I and Q components are not implicated in this DC offset component. Accordingly, one recognizes Equation 9 as a continuous wave signal at the frequency $\omega_c$.

Turning now to the IQ components of Equation 8, the portion of the resulting signal of the components related to the original I and Q signals is given in Equation 10 as:

$$V_{IQ}(t)=(A+\beta)\cdot[I_{IF}(t)\cdot\cos(\omega_c t+\phi)]+(A-\beta)\cdot[Q_{IF}(t)\cdot\sin(\omega_c t-\phi)].\qquad\text{(Eq. 10)}$$

Using the trigonometric identities of $\cos(A+B)=\cos A\cos B-\sin A\sin B$, and $\sin(A-B)=\sin A\cos B-\cos A\sin B$, Equation 10 can be rewritten as:

$$(A+\beta)\cdot I_{IF}(t)\cdot[\cos(\omega_c t)\cos(\phi)-\sin(\omega_c t)\sin(\phi)]+(A-\beta)\cdot Q_{IF}(t)\cdot[\sin(\omega_c t)\cos(\phi)-\cos(\omega_c t)\sin(\phi)].\qquad\text{(Eqn. 11)}$$

Equation 11 leads to:

$$A(I_{IF}(t))(\cos(\omega_c t)\cos(\phi))-A(I_{IF}(t))(\sin(\omega_c t)\sin(\phi))+\beta(I_{IF}(t))(\cos(\omega_c t)\cos(\phi))-\beta(I_{IF}(t))(\sin(\omega_c t)\sin(\phi))+A(Q_{IF}(t))(\sin(\omega_c t)\cos(\phi))-A(Q_{IF}(t))(\cos(\omega_c t)\sin(\phi))-\beta(Q_{IF}(t))(\sin(\omega_c t)\cos(\phi))+\beta(Q_{IF}(t))(\cos(\omega_c t)\sin(\phi)).\qquad\text{(Eqn. 12)}$$

Rearranging, Equation 12 can be viewed as a summation of four components.

These components are:

$$A \cos(\phi)[I_{IF}(t)\cos(\omega_c t)+Q_{IF}(t)\sin(\omega_c t)] \quad \text{(Eqn. 13)}$$

$$-A \sin(\phi)[Q_{IF}(t)\cos(\omega_c t)+I_{IF}(t)\sin(\omega_c t)] \quad \text{(Eqn. 14)}$$

$$\beta\cos(\phi)[I_{IF}(t)\cos(\omega_c t)-Q_{IF}(t)\sin(\omega_c t)] \quad \text{(Eqn. 15)}$$

$$\beta\sin(\phi)[Q_{IF}(t)\cos(\omega_c t)-I_{IF}(t)\sin(\omega_c t)]. \quad \text{(Eqn. 16)}$$

Using the trigonometric identities cited above, and the fact that the Hilbert transformation of $I_{IF}$ is $Q_{IF}$, it can be shown that Equations 14 and 15 refer to components in an upper side band centered at the frequency $\omega_c+\omega_{IF}$. Correspondingly, it can be shown that the Equations 13 and 16 refer to components in a lower side band centered at the frequency $\omega_c-\omega_{IF}$.

Thus, when selecting the LSB operation in the quadrature modulator, the dissection of the full signal that is produced when phase and gain imbalances are present, as well as DC offsets, several components of energy are created. Equation 8 implicates that the DC bias, the phase, and the gain imbalance creates a component in the sideband of interest, namely the LSB. Additionally, other components in other bands are produced as well.

First, the DC bias results in a continuous wave signal centered at $\omega_c$. Next, when an LSB is produced at the quadrature modulator, an out of band component is produced. In the case of producing an LSB, this out of band component is centered at $\omega_c+\omega_{IF}$, or the corresponding upper side band. Finally, an inband component centered at $\omega_c-\omega_{IF}$ is produced.

Turning now to the components produced according to Equations 13 and 16, these relate to energy produced in the original inband portion of the intended result of the quadrature modulator operation. Adding these portions produces the result of:

$$V_{LSB}=A \cos(\phi)[I_{IF}(t)\cos(\omega_c t)+Q_{IF}(t)\sin(\omega_c t)]+\beta\sin(\phi)[Q_{IF}(t)\cos(\omega_c t)-I_{IF}(t)\sin(\omega_c t)]. \quad \text{(Eqn. 17)}$$

Using the trigonometric identities cited above, the summation in Equation 17 of the inband components of the signal generated by the quadrature modulator may be rewritten as in Equation 18:

$$[(I'_{IF}\cos(\omega_{IF}t))-(Q'_{IF}\sin(\omega_{IF}t))] \cos(\omega_c t)+[(I'_{IF}\sin(\omega_{IF}t))+(Q'_{IF}\cos(\omega_{IF}t))]\sin(\omega_c t). \quad \text{(Eqn. 18)}$$

where:

$$I'_{IF}=\beta Q(t)\sin(\phi)+AI(t)\cos(\phi),$$

and $$Q'_{IF}=AQ(t)\cos(\phi)-\beta I(t)\sin(\phi).$$

Accordingly, we can rearrange the first portion of Equation 18 multiplied by the $\cos(\omega_c t)$ component, and group together those subcomponents having I(t) and Q(t) together. Thus the component:

$$[(I'_{IF}\cos(\omega_{IF}t))-(Q'_{IF}\sin(\omega_{IF}t))] \cos(\omega_c t)$$

can be rearranged as:

$$[Q(t)\sin(\phi)\cos(\omega_{IF}t)+AI(t)\cos(\phi)\cos(\omega_{IF}t)-AQ(t)\cos(\phi)\sin(\omega_{IF}t)+\beta I(t)\sin(\phi)\sin(\omega_{IF}t)] \cos(\omega_c t). \quad \text{(Eqn. 19)}$$

Grouping the subcomponents of Equation 19 together by functions of I(t) and Q(t) yields:

$$[Q(t)[\beta \sin(\phi)\cos(\omega_{IF}t)-A\cos(\phi)\sin(\omega_{IF}t)]+I(t)[A\cos(\phi)\cos(\omega_{IF}t)+\beta \sin(\phi)\sin(\omega_{IF}t)]] \cos(\omega_c t). \quad \text{(Eqn. 20)}$$

Equation 20 yields that the components in $\cos(\omega_c t)$ are rotated and scaled versions of the original I(t) and Q(t) that would have been produced in the quadrature modulator absent any imbalances. Further, it can be ascertained that the I(t) portion is also orthogonal to the Q(t) portion.

Similarly, we can rearrange the second portion of Equation 18 having the $\sin(\omega_c t)$ component in common. Again, we can group the components having I(t) and Q(t) together. Thus, like that shown above, the component:

$$[(I'_{IF}\cdot\sin(\omega_{IF}t))+(Q'_{IF}\cdot\cos(\omega_{IF}t))] \sin(\omega_c t)$$

can be rearranged as:

$$[\beta Q(t)\sin(\phi)\sin(\omega_{IF}t)+AI(t)\cos(\phi)\sin(\omega_{IF}t)+AQ(t)\cos(\phi)\cos(\omega_{IF}t)-\beta I(t)\sin(\phi)\cos(\omega_{IF}t)]\sin(\omega_c t). \quad \text{(Eqn. 21)}$$

Again, grouping the subcomponents of Equation 21 together by functions of I(t) and Q(t) yields:

$$[Q(t)[\beta \sin(\phi)\sin(\omega_{IF}t)+A\cos(\phi)\cos(\omega_{IF}t)]+I(t)[A\cos(\phi)\sin(\omega_{IF}t)-\beta \sin(\phi)\cos(\omega_{IF}t)]] \sin(\omega_c t). \quad \text{(Eqn. 22)}$$

Equation 22 yields that the components in $\sin(\omega_c t)$ are rotated and scaled versions of the original I(t) and Q(t) that would have been produced in the quadrature modulator absent any imbalances. Further, it can be ascertained that the I(t) portion is also orthogonal to the Q(t) portion.

Accordingly, the inband component of the signal produced with a DC bias, and any phase and/or gain imbalances, is itself a scaled and rotated version of the originally desired modulated signal. Thus, the resulting signal in the inband portion is a rotated and scaled version of the originally desired signal.

Figure 2A:
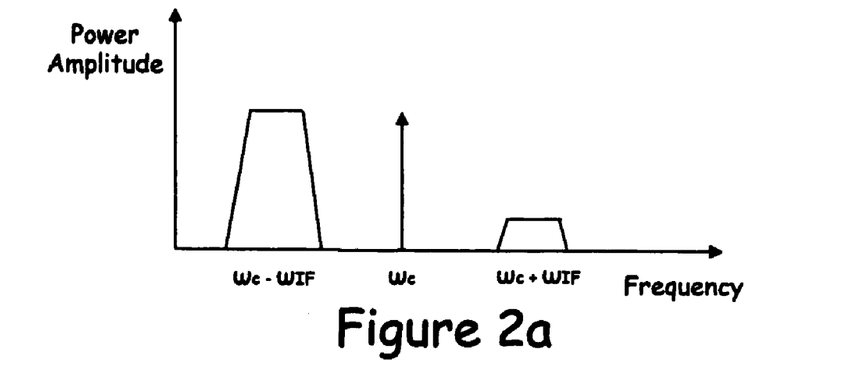
FIGS. 2a, 2b, and 2c are frequency diagrams of the output of the original input signal having a phase imbalance, a gain imbalance, and possible DC bias in modulated to a lower sideband frequency and filtered, in accordance with the invention.
Figure 2B:
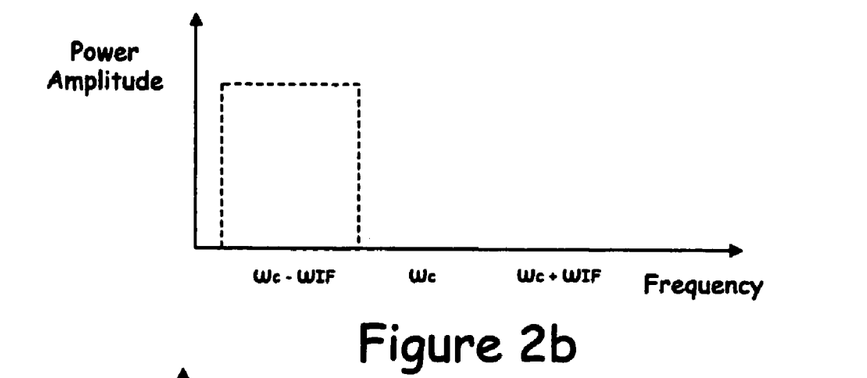
Figure 2C:
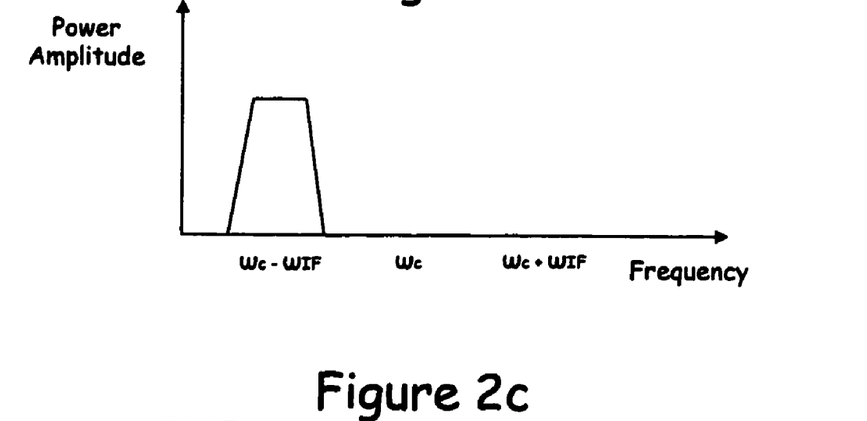

FIGS. 2a, 2b, and 2c are frequency diagrams of the output of the original input signal having a phase imbalance, a gain imbalance, and possible DC bias in modulated to a lower sideband frequency and filtered, in accordance with the invention. In FIG. 2a, the signal at the quadrature modulator is modulated to the LSB. The system has an inherent phase imbalance, a gain imbalance, and possible DC bias. Accordingly, the three components, as described above, are produced. The components reside in the inband frequency (lower sideband in this case), at the baseband frequency, and at the upper sideband.

The output signal shown in FIG. 2a is indicative of point N in FIG. 1, prior to the RF filter 18. For purposes of discussion of FIGS. 2a–c, the RF filter is a passband filter centered at the LSB.

The passband filter passes the components in the LSB range while blocking those at the USB range, as is shown in FIG. 2b. In practice, it should be noted that the difference between the LSB and USB center frequencies is $2\omega_{IF}$, and the difference between the DC biased center and the center of the appropriate passband is $\omega_{IF}$. FIG. 2c is the filtered LSB component sent to broadcast.

It should be noted that the Equations 8–22 may have corollaries generated for the case when the upper side band is selected for Equation 7. In the case of using the quadrature modulator to modulate to the USB, three frequency spectra are present.

When selecting the USB, the components in the USB inband portion contain the rotated and scaled signal. In this case, the DC bias results in a continuous wave signal centered at $\omega_c$. Next, an out of band component is produced that is centered at $\omega_c-\omega_{IF}$ when the quadrature modulator is used to produce an upper sideband signal. Finally, an inband component centered at $\omega_c+\omega_{IF}$ is produced. This inband component of the USB modulated signal has the same properties as does the LSB of the LSB signal spelled out in detail above.

In the case of the quadrature modulator producing an USB signal, the RF filter would be used to passband filter the signal in the area centered on $\omega_c+\omega_{IF}$. Accordingly, both the USB and LSB forms may be used.

In this cases, the inband portion (the USB portion) can be shown to contain the rotated and scaled versions of the I and Q functions. In this case, the passband filter should be constructed to screen out the LSB and the baseband, and allow the USB component to pass.

Figure 3A:
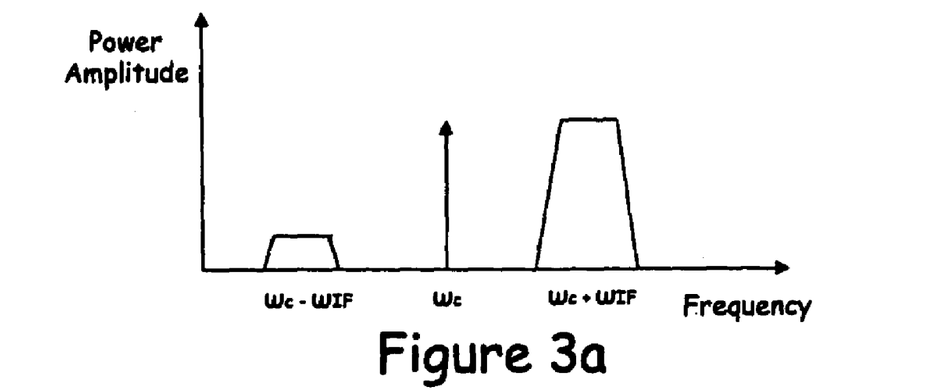
FIGS. 3a, 3b, and 3c are frequency diagrams of the output of the original input signal having a phase imbalance, a gain imbalance, and possible DC bias in modulated to an upper sideband frequency and filtered, in accordance with the invention.
Figure 3B:
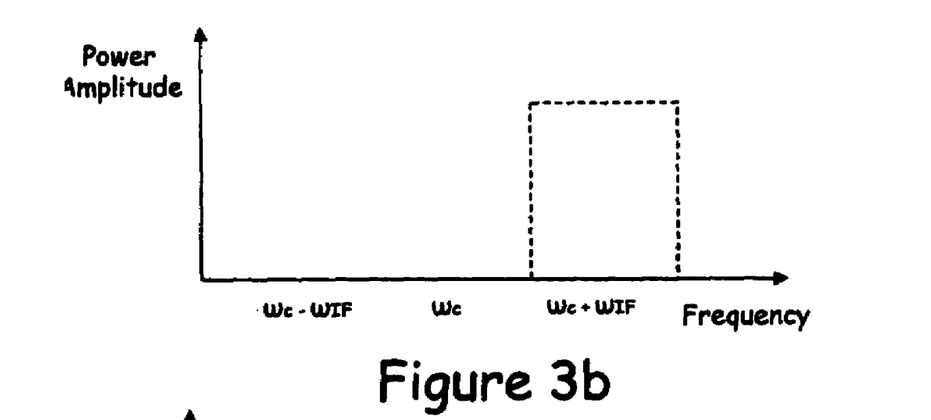
Figure 3C:
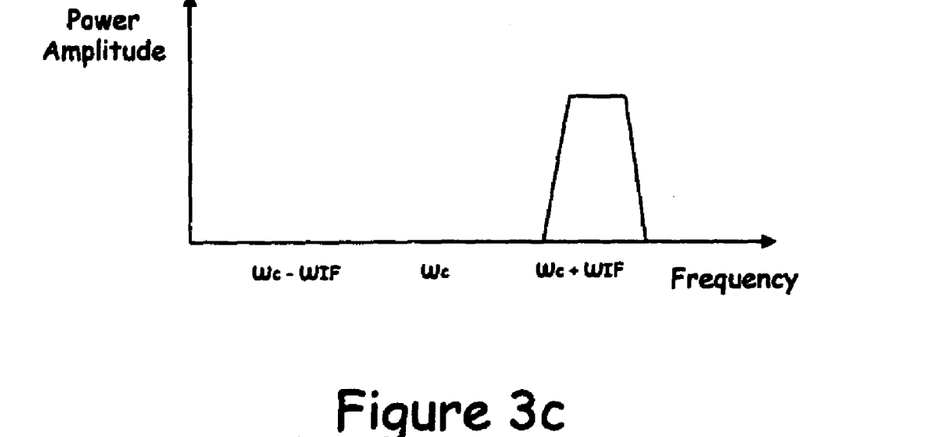

FIGS. 3a, 3b, and 3c are frequency diagrams of the output of the original input signal having a phase imbalance, a gain imbalance, and possible DC bias in modulated to an upper sideband frequency and filtered, in accordance with the invention. In FIG. 3a, the signal at the quadrature modulator is modulated to the USB. When the various imbalances (DC bias, phase imbalance, and/or gain imbalance) are present, instead of the single component generated at the upper sideband, the generated signal contains three components, as discussed above.

The output signal shown in FIG. 3a is indicative of point N in FIG. 1, prior to the RF filter 18 when the quadrature modulator generates an upper sideband signal. In this case, the RF filter is a passband filter centered at the USB.

Thus, when the quadrature modulator modulates to an upper sideband frequency, the passband filter should pass those components present at the USB range. Accordingly, the passband filter should block those components at the LSB as well as at the baseband frequency. Again, it should be noted that the difference between the LSB and USB center frequencies is $2\omega_{IF}$, and the difference between the DC biased center and the center of the appropriate passband is $\omega_{IF}$. FIG. 3c is the filtered USB component sent to broadcast.

Now, the broadcast signal is not the IQ modulated signal as originally intended. The broadcast signal is, however, a scaled and rotated version of the originally intended IQ modulated signal. The phase shift and scale of the passed signal is of little significance at the receive-end of the communication system. This is due to the fact that a signal is always received in an arbitrary phase at the demodulator, depending upon the propagation delay. Further, a signal typically arrives with varied gain as a result of channel attenuation. In this manner, most receivers incorporate algorithms to compensate for such linear phase and gain errors. Accordingly, the rotated and scaled inband portion of the signal is a balanced signal, and may be processed accordingly.

Thus, it can be shown that when the LSB of the original modulated signal is taken as the result of the quadrature modulator, the system can be used to compensate for phase and gain imbalances, as well as DC offsets. Using similar techniques, it can be shown when the USB portion of the quadrature modulator is selected, the resulting signal when modulated with a phase or gain imbalance, or with a DC offset, produces the same type of spectra.

Thus, a system and method for system and method for an improved quadrature upconverter for I/Q modulation using intermediate frequency carriers. is described and illustrated. Those skilled in the art will recognize that many modifications and variations of the present invention are possible without departing from the invention. Of course, the various features depicted in each of the Figures and the accompanying text may be combined together. Accordingly, it should be clearly understood that the present invention is not intended to be limited by the particular features specifically described and illustrated in the drawings, but the concept of the present invention is to be measured by the scope of the appended claims. It should be understood that various changes, substitutions, and alterations could be made hereto without departing from the spirit and scope of the invention as described by the appended claims that follow.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A signal transmitter for sending a radio signal, the transmitter comprising:

an input for receiving input data;

a first circuit for generating an inphase signal and a quadrature signal from the input data;

a second circuit that produces a first signal associated with a cosine of a first frequency;

a third circuit that produces a second signal associated with a sine of the first frequency;

a first modulator, coupled to the first circuit and the second circuit, that upconverts the inphase signal with the first signal and produces a first upconverted signal;

a second modulator, coupled to the first circuit and the third circuit, that upconverts the inphase signal with the second signal and produces a second upconverted signal;

a third modulator, coupled to the first circuit and the second circuit, that upconverts the quadrature signal with the first signal and produces a third upconverted signal;

a fourth modulator, coupled to the first circuit and the third circuit, that upconverts the quadrature signal with the second signal and produces a fourth upconverted signal;

a fourth circuit, coupled to the first and fourth modulators, that combines the first upconverted signal and the fourth upconverted signal into a first intermediate signal;

a fifth circuit, coupled to the second and third modulators, that combines an inverse of the second upconverted signal and the third upconverted signal into a second intermediate signal;

a quadrature modulator, coupled to the fourth circuit and the fifth circuit, that converts the first intermediate frequency signal and the second intermediate frequency signal to an output signal, the output signal having a component at a first sideband of a second frequency, the sideband frequency offset from the second frequency by a first amount; and a filter, coupled to the quadrature modulator, that passes the sideband frequency, and filters the second frequency and a second sideband, the second sideband offset from the second frequency by the inverse of the first amount.

2. The transmitter of claim 1 wherein the first sideband is a lower sideband frequency the second sideband is an upper sideband.

3. The transmitter of claim 1 wherein the first sideband is an upper sideband and the second sideband is a lower sideband.

4. The transmitter of claim 1 wherein a component of the output signal at approximately the second frequency is associated with a DC bias.

5. The transmitter of claim 1 wherein the component of the output signal at the first sideband is a rotated version of the output of the quadrature modulator having as inputs the inphase and quadrature signals.

6. The transmitter of claim 1 wherein the component of the output signal at the first sideband is a scaled version of the output of the quadrature modulator having as inputs the inphase and quadrature signals.

7. The transmitter of claim 1 wherein the component of the output signal at the first sideband is a rotated and scaled version of the output of the quadrature modulator having as inputs the inphase and quadrature signals.

8. A signal transmitter for sending a radio signal
an input for receiving input data;
a first circuit for generating an inphase signal and a quadrature signal from the input data;
a second circuit that produces a first signal associated with an intermediate frequency;
a third circuit that produces a second signal associated with a Hilbert transformation of the first signal;
a first modulator, coupled to the first circuit and the second circuit, that modulates the inphase signal with the first signal and produces a first upconverted signal;
a second modulator, coupled to the first circuit and the third circuit, that modulates the inphase signal with the second signal and produces a second upconverted signal;
a third modulator, coupled to the first circuit and the second circuit, that modulates the quadrature signal with the first signal and produces a third upconverted signal;
a fourth modulator, coupled to the first circuit and the third circuit, that modulates the quadrature signal with the second signal and produces a fourth upconverted signal;
a fourth circuit, coupled to the first modulator and the fourth modulator, that produces a first intermediate signal comprising a linear combination of the first signal and the second signal;
a fifth circuit, coupled to the first modulator and the fourth modulator, that produces a second intermediate signal comprising a linear combination of the second signal and an inverse of the first signal;
a modulator associated with a first frequency, coupled to the fourth circuit and the fifth circuit, that produces an output signal associated with an inband sideband frequency centered at an offset from the first frequency, the output signal comprising:
 a first component located approximately in a first frequency range centered approximately at the inband sideband frequency;
 a second component located approximately in a second frequency range centered at the first frequency; and
 a third component located approximately in a second frequency range centered at another sideband frequency;
a filter, coupled to the modulator, that filters the second component and the third component from a final output signal; and wherein the first component is a rotated version of the output of the quadrature modulator having as inputs the inphase and quadrature signals.

9. The transmitter of claim 8 wherein the first component is located in a lower sideband frequency and the third component is located in an upper sideband frequency.

10. The transmitter of claim 8 wherein the first component is located in an upper sideband frequency and the third component is located in a lower sideband frequency.

11. The transmitter of claim 8 wherein the second component of the output signal is associated with a DC bias.

12. The transmitter of claim 8 wherein the component of the output signal at the first sideband is a scaled version of the output of the quadrature modulator having as inputs the inphase and quadrature signals.

13. A signal transmitter for sending a radio signal
an input for receiving input data;
a first circuit for generating an inphase signal and a quadrature signal from the input data;
a second circuit that produces a first signal associated with a first frequency;
a third circuit that produces a second signal associated with a Hilbert transformation of the first signal;
a first modulator, coupled to the first circuit and the second circuit, that modulates the inphase signal with the first signal and produces a third signal;
a second modulator, coupled to the first circuit and the third circuit, that modulates the inphase signal with the second signal and produces a fourth signal;
a third modulator, coupled to the first circuit and the second circuit, that modulates the quadrature signal with the first signal and produces a fifth signal;
a fourth modulator, coupled to the first circuit and the third circuit, that modulates the quadrature signal with the second signal and produces a sixth signal;
a fourth circuit, coupled to the first modulator and the fourth modulator, that produces a first intermediate signal comprising a linear combination of the third signal and the sixth signal;
a fifth circuit, coupled to the first modulator and the fourth modulator, that produces a second intermediate signal comprising a linear combination of the fourth signal and an inverse of the fifth signal;
a modulator associated with a second frequency, coupled to the fourth circuit and the fifth circuit, that modulates the first intermediate signal and the second intermediate signal and produces a seventh signal; and
a filter, coupled to the modulator;
wherein the seventh signal comprises:
 a first component located in a first frequency range centered on a sideband at on offset from the second frequency, the first component associated with a rotated version of an output of the modulator having inputs of the inphase and quadrature signals;
 a second component located in a second frequency range centered approximately at the second frequency;
 a third component located in a third frequency range centered on a sideband at the inverse of the offset from the second frequency;
wherein the filter filters the second component and the third component from a final output signal.

14. The transmitter of claim 13 wherein the first component is located in a lower sideband frequency and the third component is located in an upper sideband frequency.

15. The transmitter of claim 13 wherein the first component is located in an upper sideband frequency and the third component is located in a lower sideband frequency.

16. The transmitter of claim 13 wherein the second component of the output signal is associated with a DC bias.

17. The transmitter of claim 13 wherein the component of the output signal at the first sideband is a scaled version of the output of the quadrature modulator having as inputs the inphase and quadrature signals.

18. A method for generating a radio signal, the transmitter comprising:
   receiving input data;
   generating an inphase signal and a quadrature signal from the input data;
   producing a first signal associated with a cosine of a first frequency;
   producing a second signal associated with a sine of the first frequency;
   upconverting the inphase signal with the first signal, producing a third signal;
   upconverting the inphase signal with the second signal, producing a fourth signal;
   upconverting the quadrature signal with the first signal, producing a fifth signal;
   upconverting the quadrature signal with the second signal, producing a sixth signal;
   summing the third signal and the sixth signal into a first intermediate signal;
   summing the fourth signal and the fifth signal into a second intermediate signal;
   converting the first intermediate signal and the second intermediate signal to an output signal, the output signal having a first component centered at approximately a first sideband of a second frequency, the first sideband offset from the second frequency by a first amount; and
   filtering the output signal to block the second frequency and a second sideband, the second sideband offset from the second frequency by the inverse of the first amount.

19. The method of claim 18 wherein the first sideband is a lower sideband the second sideband is an upper sideband.

20. The method of claim 18 wherein the first sideband is an upper sideband and the second sideband is a lower sideband.

21. The method of claim 18 wherein a component of the output signal centered at approximately the second frequency is associated with a DC bias.

22. The method of claim 18 wherein the first component is a rotated version of the output of the step of converting when the inputs would be the inphase and the quadrature signals.

23. The method of claim 18 wherein the first component a scaled version of the output of the step of converting when the inputs would be the inphase and the quadrature signals.

24. The method of claim 18 wherein the first component is a rotated and scaled version of the step of converting when the inputs would be the inphase and the quadrature signals.

25. A signal transmitter for sending a radio signal
   receiving input data;
   generating an inphase signal and a quadrature signal from the input data;
   producing a first signal associated with first frequency;
   producing a second signal associated with a Hilbert transformation of the first signal;
   modulating the inphase signal with the first signal to produce a third signal;
   modulating the inphase signal with the second signal to produces a fourth signal;
   modulating the quadrature signal with the first signal to produce a fifth signal;
   modulating the quadrature signal with the second signal to produce a sixth signal;
   producing a seventh signal comprising a linear combination of the third signal and the sixth signal;
   producing an eighth signal comprising a linear combination of the fourth signal and the inverse of the fifth signal;
   producing a ninth signal from the seventh signal and the eighth signal, the ninth signal associated with a first sideband of a second frequency, the center of the first sideband offset from the second frequency by an offset associated with the first frequency; and
   filtering the second component and the third component;
   wherein the ninth signal comprises:
      a first component located approximately in a first frequency range centered approximately at the first sideband;
      a second component located approximately in a second frequency range centered approximately at the second frequency;
      a third component located approximately in a third frequency range centered at a second sideband;
      wherein the first component is a rotated version of the output of the step of producing a ninth signal when the inputs would be the inphase and quadrature signals.

26. A method for generating a radio signal, the transmitter comprising:
   means for receiving input data;
   means for generating an inphase signal and a quadrature signal from the input data;
   means for producing a first signal associated with a cosine of a first frequency;
   means for producing a second signal associated with a sine of the first frequency;
   means for upconverting the inphase signal with the first signal, producing a third signal;
   means for upconverting the inphase signal with the second signal, producing a fourth signal;
   means for upconverting the quadrature signal with the first signal, producing a fifth signal;
   means for upconverting the quadrature signal with the second signal, producing a sixth signal;
   means for linearly combining the third signal and the sixth signal into a first intermediate signal;
   means for linearly combining the fourth signal and the fifth signal into a second intermediate signal;
   means for converting the first intermediate signal and the second intermediate signal to an output signal, the output signal having a first component centered at approximately a first sideband of a second frequency, the first sideband offset from the second frequency by a first amount; and
   means for filtering the output signal to block the second frequency and a second sideband, the second sideband offset from the second frequency by the inverse of the first amount.

27. A signal transmitter for sending a radio signal
   means for receiving input data;
   means for generating an inphase signal and a quadrature signal from the input data;
   means for producing a first signal associated with first frequency;
   means for producing a second signal associated with a Hilbert transformation of the first signal;
   means for modulating the inphase signal with the first signal to produce a third signal;

means for modulating the inphase signal with the second signal to produces a fourth signal;

means for modulating the quadrature signal with the first signal to produce a fifth signal;

means for modulating the quadrature signal with the second signal to produce a sixth signal;

means for producing a seventh signal comprising a linear combination of the third signal and the sixth signal;

means for producing an eighth signal comprising a linear combination of the fourth signal and the inverse of the fifth signal;

means for producing a ninth signal from the seventh signal and the eighth signal, the ninth signal associated with a first sideband of a second frequency, the center of the first sideband offset from the second frequency by an offset associated with the first frequency; and means for filtering;

wherein the ninth signal comprises:
   a first component located approximately in a first frequency range centered approximately at the first sideband;
   a second component located approximately in a second frequency range centered approximately at the second frequency;
   a third component located approximately in a third frequency range centered at a second sideband;

wherein the means for filtering filters the second component and the third component;

wherein the first component is a rotated version of the output of the step of producing a ninth signal when the inputs would be the inphase and quadrature signals.

* * * * *